United States Patent
Girardey et al.

(10) Patent No.: US 10,721,818 B2
(45) Date of Patent: Jul. 21, 2020

(54) METHOD FOR POSITIONING CIRCUIT BOARDS AND CIRCUIT BOARD ARRANGEMENT

(71) Applicant: Endress+Hauser SE+Co. KG, Maulburg (DE)

(72) Inventors: Romuald Girardey, Blotzheim (FR); Dietmar Birgel, Schopfheim (DE); Armend Zenuni, Lörrach (DE); Marc Baret, Kembs (FR); Peter Klöfer, Steinen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 0 days.

(21) Appl. No.: 16/093,531

(22) PCT Filed: Mar. 16, 2017

(86) PCT No.: PCT/EP2017/056208
§ 371 (c)(1),
(2) Date: Oct. 12, 2018

(87) PCT Pub. No.: WO2017/178186
PCT Pub. Date: Oct. 19, 2017

(65) Prior Publication Data
US 2019/0124770 A1    Apr. 25, 2019

(30) Foreign Application Priority Data

Apr. 14, 2016  (DE) .................. 10 2016 106 900

(51) Int. Cl.
*H05K 1/00* (2006.01)
*H05K 1/14* (2006.01)
*H05K 3/36* (2006.01)

(52) U.S. Cl.
CPC ............. *H05K 1/141* (2013.01); *H05K 3/368* (2013.01); *H05K 2201/044* (2013.01); *H05K 2201/0999* (2013.01); *H05K 2201/09754* (2013.01)

(58) Field of Classification Search
USPC .................................................. 361/748, 760
See application file for complete search history.

(56) References Cited

U.S. PATENT DOCUMENTS

| | | | |
|---|---|---|---|
| 4,508,398 A * | 4/1985 | Stepan ................... | H05K 3/368 439/65 |
| 2003/0087558 A1* | 5/2003 | Korsunsky ......... | H01R 13/6658 439/676 |
| 2015/0325755 A1* | 11/2015 | Speer .................... | H01L 33/486 257/99 |

FOREIGN PATENT DOCUMENTS

| DE | 69501011 T2 | 3/1988 |
|---|---|---|
| DE | 19921659 A1 | 12/2000 |

(Continued)

OTHER PUBLICATIONS

International Search Report for Patent Application No. PCT/EP2017/056208, WIPO, dated Mar. 16, 2017, 11 pp.

*Primary Examiner* — Andargie M Aychillhum
(74) *Attorney, Agent, or Firm* — Kelly J. Smith; Endress+Hauser (USA) Holding Inc.

(57) ABSTRACT

The present disclosure relates to a method for positioning at least two circuit boards in a housing having a non-conductive surface, a first securement location for securing the first circuit board, and a second securement location for securing the second circuit board, wherein at least one conductive trace is arranged in the housing and is connected non-releasably with the housing, and wherein the conductive trace electrically contacts the first securement location with the second securement location, the method comprising (Continued)

securing the circuit boards in the securement locations of the housing such that the first circuit board is electrically in contact with the first securement location and the second circuit board is electrically in contact with the second securement location, wherein the first circuit board and the second circuit board are electrically in contact with one another via the at least one conductive trace.

15 Claims, 2 Drawing Sheets

(56) References Cited

FOREIGN PATENT DOCUMENTS

| | | |
|---|---|---|
| DE | 19944383 A1 | 4/2001 |
| GB | 2095039 A | 9/1982 |
| WO | 2016019517 A1 | 2/2016 |

* cited by examiner

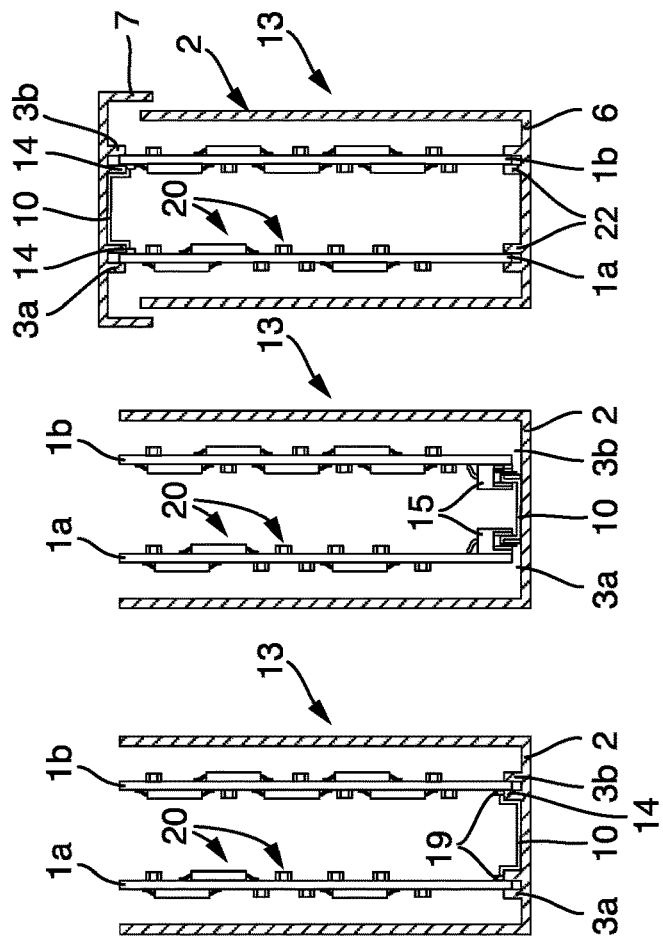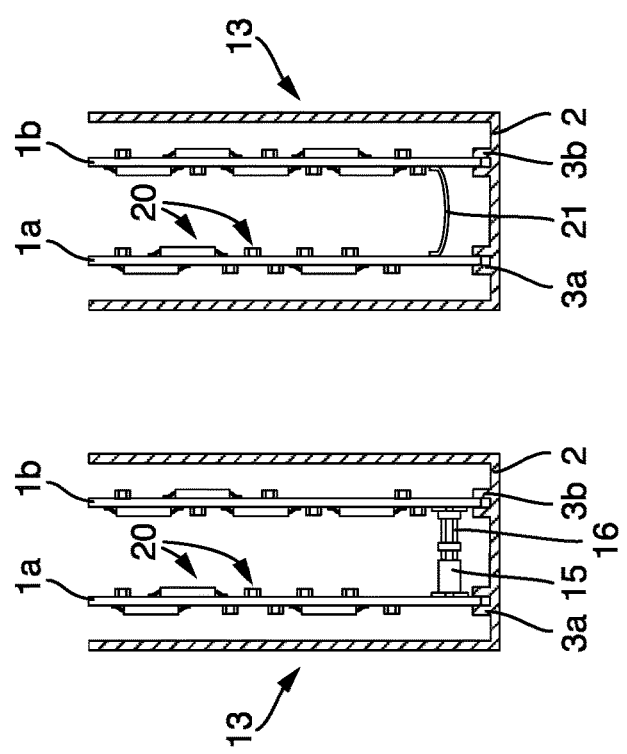

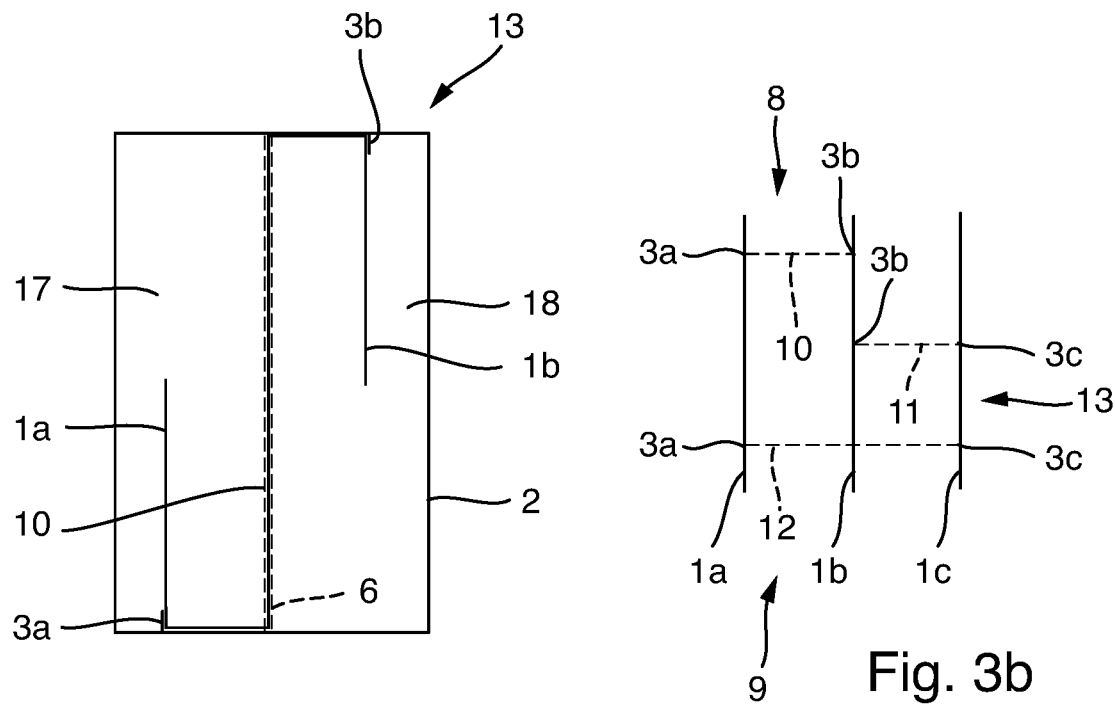
Fig. 3a
Fig. 3b
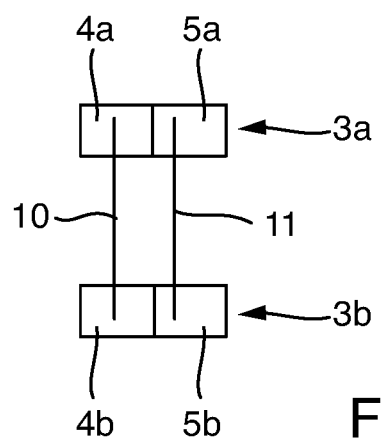
Fig. 4

METHOD FOR POSITIONING CIRCUIT BOARDS AND CIRCUIT BOARD ARRANGEMENT

CROSS-REFERENCE TO RELATED APPLICATIONS

The present application is related to and claims the priority benefit of German Patent Application No. 10 2016 106 900.0, filed on Apr. 14, 2016 and International Patent Application No. PCT/EP2017/056208, filed on Mar. 16, 2017, the entire contents of which are incorporated herein by reference.

TECHNICAL FIELD

The invention relates to a method for positioning circuit boards in a housing of a field device of process and/or automation technology, as well as to a circuit board arrangement of circuit boards electrically in contact with one another in a housing of a field device of process and/or automation technology.

BACKGROUND

In process and automation technology, field devices are applied for determining and/or monitoring process variables, including physical or chemical process variables. A field device typically includes at least one sensor unit coming at least partially and at least at times in contact with the process. Referred to as field devices in the case of the present disclosure are, in principle, all measuring devices, which are applied near to the process and which deliver, or process, process relevant information. Involved, for example, are fill level measuring devices, flow measuring devices, pressure and temperature measuring devices, pH-redox potential measuring devices, conductivity measuring devices, etc., which register the corresponding process variables, fill level, flow, pressure, temperature, pH-value, and conductivity. Such field devices are manufactured and sold in various embodiments by the E+H group of companies.

Such field devices contain, generally, electronic components, which are usually arranged and soldered with one another on a planar circuit board. Often, in such case, a number of circuit boards are installed in a non-conductive housing of the field device or a conductive housing having at least a non-conductive surface, wherein typically the planes of the different circuit boards are oriented parallel to one another in the housing. In such case, one or more electrical contacts are provided between the circuit boards, which serve, for example, for electrical current supply or for data transfer between the different circuit boards. Such circuit board arrangements in a housing are used in the most varied of field devices of the Endress+Hauser group.

Generally in such case, additional components, which serve for electrical contact between the circuit boards arranged and secured in the housing, must be installed in an additional method step. For example, during populating the circuit boards, a socket is soldered on a first circuit board and a plug fitting the socket is soldered on a second circuit board to be connected with the first circuit board. The socket and the plug must then be brought together in suitable manner in an additional working step during the arranging of the two circuit boards in the housing.

Alternatively to contacting with socket and plug, known from the state of the art are flexible, flat connection elements for electrical contacting of circuit boards. Examples of these flexible connection elements, also referred to as jumpers, are given in U.S. Pat. No. 6,614,664 B2 and Offenlegungsschrift DE 10 2004 037 629 A1. These flexible connection elements are soldered onto two circuit boards adjoining in a plane. This is done, for example, during the populating of the circuit boards with electronic components. The flexible connection elements have, compared with the connection with plug and socket, the advantage that the connection of two circuit boards occurs during the populating of the circuit boards with electronic components and, thus, no additional working step is necessary for effecting the connection. The flexibility of the flexible connection elements enables electrical contacting of the rigid, planar circuit boards to be led from the plane of the circuit boards uninterruptedly into another dimension. This is accomplished by bending or folding the flexible connection elements. If the two adjoining circuit boards are displaced from the shared plane and arranged in two mutually parallel planes, the flexible connection elements can, in such case, be formed, by bending and/or folding, to extend in a direction perpendicular to the circuit board plane.

In principle, it is also possible to provide a number of flexible connection elements between two neighboring circuit boards. In such case, there are, however, significant limitations on the arrangement of the flexible connection elements because they all must be arranged in a shared edge region (i.e. a shared bending edge or folding edge). Such an arrangement of the connection elements between circuit boards is not always possible since the flexible connection elements permit, generally, no more than two circuit boards to be connected without significant limitations on the spatial positioning of the flexible connection elements relative to the circuit boards.

For use of field devices in explosion endangered regions, in contrast, safety regulations for explosion protection require a spatial isolation of certain regions or certain electrical contacts. In such case, of concern, especially, is to safely prevent the forming of sparks or at least to assure that a spark possibly occurring in the interior of a closed space has no effects on the environment, in order, so, to safely avoid a possible triggering of an explosion. For example, European Standard EN 60079-7:2007 provides a protection class bearing the label "Increased Safety" (Ex-e). In the case of electronic devices, which are embodied to meet this protection class, the ignition, or explosion, protection is achieved by making the spatial distance between two different electrical potentials sufficiently large that a spark formation in the case of malfunction cannot occur, due to the distance.

For use of the field device in an explosion endangered region, it is, consequently, desirable to provide an automatable and cost-effective method for electrical contacting of circuit board arrangements in a housing of a field device, which method enables significant freedom relative to the spatial arrangements of the electrical contacts.

SUMMARY

An object of the present disclosure, therefore, is to provide a method for simultaneous positioning and electrical contacting of circuit boards in a housing as well as an arrangement of circuit boards in a housing, such that almost no limitations on the spatial arrangement of the electrical contacts exist.

The object is achieved, as regards method, by a method for positioning at least two circuit boards in a housing of a field device of automation technology, wherein at least a surface of the housing is non-conductive, wherein at least a first securement location for securing the first circuit board and a second securement location for securing the second circuit board are provided at predetermined positions in the housing, wherein at least one conductive trace is provided arranged in the housing, wherein the conductive trace is connected non-releasably with the housing, and wherein the conductive trace electrically contacts the first securement location with the second securement location, comprising steps as follows: prefabricating the circuit boards as well as the housing; and securing the circuit boards in the securement locations of the housing, wherein, upon securing of the circuit boards, the first circuit board is electrically in contact with the first securement location and the second circuit board is electrically in contact with the second securement location, such that the first and second circuit boards are electrically in contact with one another via the at least one conductive trace.

In the method of the present disclosure, thus, the conductive traces are directly integrated into the housing and are components of the housing. In such case, the conductive traces extend between at least two securement locations in the housing. Because of the securing of the at least two circuit boards in the housing, electrical contact is established between the circuit boards and their securement locations. In this way, the electrical contacting of the at least two circuit boards occurs simultaneously with the securing of the circuit boards in the housing according to the present disclosure. In such case, the conductive traces extend between securement locations, which are provided for securing the circuit boards in predetermined positions. Also, the circuit board is, in such case, secured with a predetermined region at the predetermined position. Based on the predetermined positions and the conductive traces, which extend between the securement locations, thus, also predetermined regions of the circuit boards are electrically in contact with one another. This means that the housing and the therein extending conductive traces are so dimensioned and embodied that they are provided for connection of predetermined regions of predetermined circuit boards. In the prefabrication of the housing in the first method step, in such case, the housing including the securement locations and the conductive traces extending between the securement locations are manufactured with the required topology of the conductive traces.

In an embodiment of the method of the invention, the conductive trace arranged in the housing and connected non-releasably with the housing is formed using a method for manufacturing three dimensional, injection molded, circuit supports or Molded Interconnect Devices (MID). An embodiment including an MID includes an injection molded plastic part, into which a metal structure has been non-releasably introduced, which is typically embodied as a conductive trace. In such case, there are almost no limitations on the geometric shape of the plastic part and the spatial arrangement of the metal structure within the plastic part. An overview of established manufacturing processes for making MIDs is published, for example, by "Forschungsvereinigung Räumliche Elektronische Baugruppen 3-D MID e.V." (Research Association Molded Interconnect Devices 3-D MID e.V.). Latest methods for manufacturing MIDs include two component injection molding, hot embossing, mask illumination method, laser structuring and film back molding. In such case, a basic distinction is made between subtractively structuring and additively metallizing manufacturing processes.

In the case of laser direct structuring (LDS), for example, there is, first, the full surface metallizing of the support. Thereafter, the metal layer is structured subtractively. LDS is described in Offenlegungsschrift DE 101 32 092 A1 and references cited therein. In contrast, the MID manufacturing process referred to as "Flamecon" is an additive method, in which the metal to be deposited is melted and sprayed onto the surface by pressure. A further completely additive MID manufacturing process is the hot embossing method. In such case, the injection formed part is placed in an embossing press, wherein a surface modified metal foil is simultaneously pressed with an embossing tool and connected with the injection formed part by applying pressure and heat. The manufacturing processes mentioned here are certainly not a complete listing. In the context of the present disclosure, MIDs refer to the combination of an injection molded housing and a conductive trace non-releasably connected therewith, with essentially no limitation as to the geometric shape of the housing or the arrangement of the conductive trace in the housing.

The use of methods for manufacturing MIDs for manufacturing such a housing would, in principle, even eliminate the application of circuit boards, in that the electronic components could be populated directly on the housing. However, in the case of housings of unlimited shape, populating apparatuses would have to be used, which enable the completely three-dimensional populating of non-planar components. Such populating apparatuses would be very costly, so that the complete elimination of circuit boards would be suitable only for very particular and non-automatable arrangements of electronic components. For this reason, it is in the case of industrial manufacture of a field device of automation technology, generally, advantageous still to arrange the electronic components of a field device on planar circuit boards and to contact the completely populated planar circuit boards electrically with one another. The idea behind such an embodiment is, thus, to retain the planar circuit boards suitable for cost-effective populating and still use an MID manufacturing process for manufacture of the housing as well as the conductive traces integrated into the housing for the electrical contacting of the circuit boards. A prefabricated housing manufactured in such a manner with integrated conductive traces is especially suited for the method of the present disclosure, in which the electrical contacting of the circuit boards occurs simultaneously with the securing of the circuit boards in the housing.

In an additional embodiment, the housing and/or the conductive trace arranged in the housing and non-releasably connected with the housing based are/is obtained using a generative manufacturing method. Referred to as generative manufacturing methods, or 3D printing, in the case of the present disclosure are those methods in which an object is formed by stepwise, computer controlled, building up of layers of at least one material.

Regarding the apparatus, the present disclosure includes a circuit board arrangement having at least two circuit boards, wherein the circuit boards are positioned in a housing of a field device of automation technology, wherein at least a surface of the housing is non-conductive, wherein the housing has at least a first securement location for securing the first circuit board and a second securement location for securing the second circuit board at predetermined positions, wherein the first circuit board is electrically in contact with the first securement location and the second circuit board is electrically in contact with the second securement location, wherein at least one conductive trace is provided arranged in the housing, wherein the conductive trace is connected non-releasably with the housing, and wherein the conductive trace electrically contacts the first securement location with the second securement location, such that, based on the conductive trace arranged in the housing, the first and second circuit boards are electrically in contact with one another Because of the conductive trace arranged in the housing and extending in the housing between the at least two securement locations, there is almost no limitation on the spatial arrangement. In such case, one or more conductive traces can be provided integrated into the housing. Because of the securing of the at least two circuit boards in the housing, there is an electrical contact between the circuit board and their securement locations. The housing thus includes securement locations, which serve simultaneously for contacting and securing the circuit boards with the conductive trace arranged in the housing. In this way, the circuit boards are, based on the conductive trace arranged in the housing and the securement locations, electrically in contact with one another. Of course, within the scope of the present disclosure, the housing can also have other securement locations in the housing for securing the circuit boards, wherein the additional securement locations are embodied only for mechanical securement of the circuit boards in the housing.

In an embodiment of the circuit board arrangement, the first and second securement locations are multiply electrically contactable, wherein the housing has at least two conductive traces electrically insulated from one another, and wherein, based on the conductive traces electrically insulated from one another, the first and second securement locations are multiply electrically in contact with one another in regions electrically insulated from one another. In this embodiment of the present disclosure, naturally also more than two conductive traces can be provided for electrical contact of the two securement locations.

In a further embodiment of the circuit board arrangement, the circuit boards and the securement locations are in electrical contact via contact areas, wherein, based on dimensioning of the securement locations as well as based on embodiment of the circuit boards, contact properties of the contact areas are settable. Via the embodiment of securement location and the circuit board, the contact properties can be set to predeterminable values. The contact properties of the present disclosure are, for example, the conductivity, the electrical current carrying capability, the mechanical and electrical capacity, the junction resistance, the dimensions of the contact area, etc. While in the case of conventional electrical contacts (e.g., plug/socket pairing or the flexible connection elements) the contact properties are predetermined, they can in the context of the present disclosure be set to achieve one or more goals.

In such an embodiment, it is thus possible to provide on a circuit board a number of securement locations, wherein the securement locations are each electrically in contact with the circuit board, and wherein at the electrical contacts of the various securement locations particular contact properties can be selected. Thus, within the scope of the present disclosure, it is in this way possible that the same type of contacting (namely, via the securement location) has, depending on securement location, different contact properties, such that the invention permits a multifunctional contacting. This embodiment of the present disclosure may be suitable when the field device is applied in explosion endangered regions. In such case, it is desirable, when via excellent electrical contacts high electrical currents can flow, while, in contrast, at other electrical contacts small electrical current signals must be measured.

In an embodiment of the present disclosure, at least one of the securement locations is embodied as an elastically deformable slot, wherein the circuit board is introducible into the slot, and wherein the circuit board is secured in the housing based on connection of the circuit board with the elastically deformable slot.

Since the elastically deformable slot, i.e., the securement location, is part of the housing, the housing in this embodiment must be made of an elastically deformable material. Because of the pushing of the circuit board into the elastically deformable slot, it is assured that a contact pressure different from zero dominates in the electrical contact of the electrical contacting between securement location and circuit board. This contact pressure assures that the electrical contact between securement location and circuit board is lasting.

This embodiment can be combined in especially simple manner with embodiments of the present disclosure, in which, based on dimensioning of the securement location as well as based on the embodiment of the circuit board, the contact properties of the contact area are settable. For example, with a somewhat thicker circuit board, the contact pressure can be increased and therewith the junction resistance lowered. Another embodiment includes modifying the circuit board surface in the region provided for contacting, for example, by adding a galvanic gold, to influence the conductivity. Another embodiment includes dimensioning the contact area to obtain a predeterminable junction resistance, since the junction resistance is essentially inversely proportional to the contact area.

In an additional embodiment of the present disclosure, an elastically deformable socket is arranged on the circuit board, wherein at least one securement location is embodied as a counterpart suitable for the elastically deformable socket, wherein the suitable counterpart is introducible into the elastically deformable socket, and wherein the circuit board is secured in the housing by the connection of the elastically deformable socket with the counterpart of the elastically deformable socket. For the case, in which the housing is non-elastically deformable, in this embodiment of the present disclosure, the contact pressure different from zero can be achieved based on the elastically deformable socket. Also here, a contact pressure different from zero in the electrical contact of the electrical contacting between securement location and circuit board is therewith present, because of the elastically deformable socket, so that a lasting electrical contact is obtained. Also this embodiment of the invention can be combined with other embodiments in which the contact properties of the contact area are settable. For example, the contact properties of the contact area are settable based on the dimensioning of the securement location. The socket can, in such case, be soldered on in conjunction with the populating of the circuit board with electronic components.

In another development of the present disclosure, an insulating cover layer is provided, which at least sectionally covers at least one conductive trace. The insulating cover layer, in such case, is applied, for example, during prefabrication of the housing.

In an additional further development of the present disclosure, the housing includes a plurality of housing components. This means that the housing is essentially composed of a number of components.

In a further development of this embodiment, a first housing component is pot shaped, and another housing component is lid shaped. The lid shaped housing component, in such case, is embodied for closing the pot shaped housing component. At least one conductive trace is arranged in the lid shaped housing component. In this embodiment, thus, for example, different types of contacting of different circuit boards can be implemented by replacing the lid shaped housing component.

In an additional embodiment of the invention, at least one housing component is embodied to divide the housing into at least two housing chambers spatially separated from one another, wherein the first circuit board is arranged in the first housing chamber and the second circuit board in the second housing chamber. Also this embodiment is suited for use in explosion endangered regions. In such case, at least two circuit boards are arranged in two regions spatially separated from one another. The circuit boards spatially separated from one another are, in such case, electrically in contact with one another via one or more conductive traces arranged in the housing and/or in a housing component. The spatial arrangement of circuit boards, conductive traces and housing and housing components achieved in this embodiment is not possible with circuit board connections known from the state of the art. Especially, in the state of the art, an additional, traversing circuit board ("feed-through") is used for electrical contacting of spatially separated circuit boards. In the context of the invention, in contrast, the traversing circuit board required in the state of the art can be omitted and replaced by the one or more conductive traces arranged in the housing (or in one or more housing components).

In an additional embodiment of the present disclosure, the first and second circuit boards are arranged essentially in mutually parallel planes, wherein the circuit boards are electrically in contact with one another via at least two conductive traces. The two conductive traces are, in such case, arranged essentially in oppositely lying regions of the housing. Because two different conductive traces are provided for multiple electrical contacting of two circuit boards in oppositely lying regions of the housing, this embodiment is suited also for use in explosion endangered regions.

In another development of the present disclosure, at least three essentially parallel circuit boards are provided. The three parallel circuit boards are electrically in contact with one another via at least two conductive traces, wherein the two conductive traces are arranged essentially in oppositely lying regions of the housing. Also, this development is advantageous for the use in explosion endangered regions.

In an additional embodiment of the present disclosure, at least three circuit boards are provided, wherein, via at least three conductive traces insulated from one another, the first circuit board is electrically in contact with the second circuit board (for example, via the first conductive trace), the second circuit board is electrically in contact with the third circuit board (for example, via the second conductive trace) and the first circuit board is electrically in contact with the third circuit board (for example, via the third conductive trace).

BRIEF DESCRIPTION OF THE DRAWINGS

The invention will now be explained in greater detail based on the appended drawing figures as follows:

FIGS. 1a and 1b show side views of circuit board arrangements of the state of the art;

FIGS. 2a-2c show side views of circuit board arrangements of the present disclosure;

FIGS. 3a and 2b show side views of other circuit board arrangements of the present disclosure; and FIG. 4 shows a plan view of multiply contacted securement locations of a circuit board arrangement of the present disclosure.

DETAILED DESCRIPTION

FIGS. 1a and 1b show connections of circuit board arrangements 13 of the state of the art. Shown is a side view of a housing 2 of a field device of process and automation technology and two circuit boards 1a,1b arranged therein. The circuit boards 1a,1b are populated with electronic components 20 and secured in the housing 2 at the securement locations 3a,3b, which in the state of the art serve only for the mechanical securement of the circuit boards. The connection of the two circuit boards 1a,1b is implemented in FIG. 1a with plug 16 and socket 15; thus, the connection of the two circuit boards 1a,1b occurs in an additional working step. FIG. 1b shows the connection of the two circuit boards 1a,1b implemented with a flexible connection element 21. The flexible connection element 21 has, compared with the connection with plug 16 and socket 15, indeed, the advantage that the connection of the two circuit boards 1a,1b occurs during populating with the electronic components 20. However, there is present as a result a significant limitation on the spatial arrangement of the electrical contacting between the circuit boards 1a,1b. Especially, the connection of more than two circuit boards 1a,1b with the flexible connection elements is essentially impractical.

Shown in FIGS. 2a and 2b are circuit board arrangements 13 of the present disclosure. The reference characters are, in such case, the same as in FIG. 1. For purposes of simplification, here only one conductive trace 10 and two circuit boards 1a,1b are shown; within the scope of the present disclosure, it is, however, of course, possible also to provide a number of conductive traces 10, 11, 12 and circuit boards 1a, 1b, 1c. In contrast with the state of the art, the securement locations 3a, 3b serve both for mechanical securement of the circuit boards 1a,1b in the housing 2, as well as also for the electrical contacting of the two circuit boards 1a,1b with one another. For such purpose, a conductive trace 10 is provided, which is connected non-releasably with the housing 2 and which contacts the securement locations 3a,3b with one another. In such case, the housing 2 is prefabricated with the conductive trace 10 extending therein. Also the completely populated circuit boards 1a, 1b are prefabricated. In this way, it is enabled that the electrical contacting of the invention for the two circuit boards 1a,1b occurs simultaneously with the joining with one another of the housing 2 and the circuit boards 1a,1b, wherein the circuit boards 1a,1b are electrically in contact with their respective securement locations 3a,3b, between which a conductive trace 10 extends.

FIG. 2a shows, in such case, the variant of the present disclosure, in which the securement locations 3a,3b are embodied as elastically deformable slots 14. The circuit boards 1a,1b can in this embodiment be secured in the housing 2 by pushing the circuit boards 1a,1b into their corresponding elastically deformable slots 14. In this way, the securement locations 3a,3b become electrically in contact with the circuit boards 1a,1b, i.e., with regions of the circuit boards 1a,1b. FIG. 2a shows additionally the contact areas 19 in the electrical contacts between the securement locations 3a,3b and the circuit boards 1a,1b.

For the case, in which the housing 2 is made of a non-elastically deformable material, elastically deformable sockets 15 are suitably arranged on the circuit boards 1a,1b. This is done, for example, during the populating in the prefabricating of the completely populated circuit boards 1a,1b. This embodiment is shown in FIG. 2b. Then, into the elastically deformable socket 15 can be pushed the counterpart 16 suitable for the elastically deformable socket 15. In this way, the securement locations 3a,3b become electrically in contact with the circuit boards 1a,1b, i.e. with regions of the circuit boards 1a,1b. The securement locations 3a,3b of the housing 2 are thus here embodied as counterparts 16.

FIG. 2c shows another embodiment of the circuit board arrangement 13. In this embodiment, the conductive trace 10 electrically contacting the securement locations 3a,3b with one another extends in the lid 7 of the housing, i.e. in the lid shaped housing component 7. A lid shaped housing component 7 of the invention includes, in such case, all housing components, which serve for closure of the housing 2, thus, e.g., also a shutter sealing the housing 2, an extractable floor, or an end cap.

In this embodiment, in given cases, additional securement locations 22 can be provided in the pot shaped housing component 6, wherein the additional securement locations 22 are embodied only for mechanical securement of the circuit boards 1a, 1b in the housing 2.

FIG. 3a is a schematic view of another circuit board arrangement 13 of the present disclosure. In this example of an embodiment, the housing 2 is divided into two housing chambers 17, 18 by a housing component 6 embodied as a partition (dashed line), wherein the circuit boards 1a, 1b are arranged in different housing chambers 17,18, respectively. The conductive trace 10 connected non-releasably with the housing 2 connects the circuit boards arranged in the different housing chambers 17, 18. In such case, the conductive trace 10 is at least sectionally covered by a cover layer.

FIG. 3b is a schematic, side view of a circuit board arrangement 13 of three circuit boards 1a,1b,1c; for purposes of clarity, the housing 2 is not shown. Each circuit board is electrically in contact with its own securement locations 3a,3b,3c of the housing. Each circuit board 1a,1b, 1c is, in such case, electrically in contact with two different securement locations. In this arrangement, a first conductive trace 10 electrically contacts the first circuit board 1a with the second circuit board 1b, a second conductive trace 11 electrically contacts the second circuit board 1b with the third circuit board 1c, and a third conductive trace 12 electrically contacts the first circuit board 1a with the third circuit board 1c. The conductive traces 10.11,12 are, in such case, shown as dashed lines, and can be arranged on a side wall, the floor and/or the lid of the housing 2. In this example of an embodiment, the first conductive trace 10 is arranged in an upper, first region 8 of the housing 2 and the third conductive trace 12 in an essentially oppositely lying, lower, second region 9 of the housing 2. These oppositely lying regions 8,9 are in this example the floor and the lid; they can, however, also be oppositely lying walls of the housing 2.

FIG. 4 is a plan view of multiply contacted securement locations 3a,3b of the housing 2; for purposes of simplicity, also here the housing 2 is not shown. This detailed view shows the multiply contactable securement locations 3a, 3b and two conductive traces 10.11 (shown greatly shortened). In such case, a first region 4a of the first securement location 3a is placed in electrical contact with a first region 4b of the second securement location 3b via the first conductive trace 10, and a second region 5a of the first securement location 3a is placed in electrical contact with a second region 5b of the second securement location 3b via the second conductive trace 11. The regions 4a and 5a are electrically insulated from one another, and the regions 4b and 5b are electrically insulated from one another.

The invention claimed is:

1. A method for positioning at least two circuit boards in a housing of a field device of automation technology, the method comprising:
providing a housing having a non-conductive surface, a first securement location for securing the first circuit board, and a second securement location for securing the second circuit board are provided at predetermined positions in the housing, wherein the housing includes at least one conductive trace affixed non-releasably to and integral with an inside surface of the housing, wherein the at least one conductive trace spans between and electrically connects the first securement location with the second securement location; and
securing a first circuit board in the first securement location such that the first circuit board is in electrical contact with the first securement location;
securing a second circuit board in the second securement location such that the second circuit board is in electrical contact with the second securement location,
wherein the first circuit board and second circuit board are in electrical contact with one another via the at least one conductive trace.

2. The method of claim 1, wherein the at least one conductive trace is formed using a three-dimensional manufacturing method, injection molded, or molded interconnect devices.

3. The method of claim 1, wherein the housing or the conductive trace is fabricated using a generative manufacturing method.

4. A circuit board arrangement having at least two circuit boards, the arrangement comprising a housing of a field device of automation technology having a non-conductive surface, a first securement location for securing the first circuit board, and a second securement location for securing the second circuit board are provided at predetermined positions in the housing, wherein the housing includes at least one conductive trace affixed non-releasably to the housing, wherein the at least one conductive trace spans between and electrically connects the first securement location with the second securement location, which are otherwise insulated from one another, wherein the conductive trace is positioned along and integral with an inside surface of the housing between the first securement location and the second securement location, wherein the first circuit board and second circuit board are reversibly held in the first securement location and second securement location, respectively, and in electrical contact with one another via the at least one conductive trace.

5. The circuit board arrangement of claim 4, wherein the first securement location and the second securement location are multiply electrically contactable, wherein the housing includes a second conductive trace electrically insulated from the at least one conductive trace, and wherein the first securement location and the second securement location are multiply electrically in contact with one another via regions of the housing that are electrically insulated from one another.

6. The circuit board arrangement of claim 4, wherein the first circuit board and first securement location and the second circuit board and second securement location, respectively, are in electrical contact via contact areas, and wherein contact properties of the contact areas are settable based on dimensions of the first and second securement locations and the first and second circuit boards.

7. The circuit board arrangement of claim 4, wherein at least one of the first and second securement locations is an elastically deformable slot embodied to accept the first or second circuit board, and wherein the first or second circuit board is secured in the housing by contact of the first or second circuit board with the elastically deformable slot.

8. The circuit board arrangement of claim 4, wherein:
the first or second circuit board includes an elastically deformable socket;
the first or second securement location is configured as a counterpart to the elastically deformable socket, introducible into the elastically deformable socket; and
the first and/or second circuit board is secured in the housing by connection of the elastically deformable socket with the counterpart of the elastically deformable socket.

9. The circuit board arrangement of claim 4, wherein an insulating cover layer at least sectionally covers at least one conductive trace.

10. The circuit board arrangement of claim 4, wherein the housing includes a plurality of housing components.

11. The circuit board arrangement of claim 10, wherein:
a first housing component is pot-shaped;
a second housing component is lid-shaped such that the lid-shaped housing component is configured to close the pot-shaped housing component; and
the at least one conductive trace is disposed in the lid-shaped housing component.

12. The circuit board arrangement of claim 10, wherein at least one housing component is embodied to divide the housing into at least two housing chambers spatially separated from one another, the first circuit board is disposed in a first housing chamber, and the second circuit board is disposed in a second housing chamber.

13. The circuit board arrangement of claim 4, wherein:
the first circuit board and the second circuit board are arranged in substantially mutually parallel planes;
the circuit boards are in electrical contact with one another via at least two conductive traces; and
the at least two conductive traces are arranged in opposing regions of the housing.

14. The circuit board arrangement of claim 4, wherein:
the arrangement comprises at least three essentially parallel circuit boards;
the at least three circuit boards are in electrical contact with one another via at least two conductive traces; and
the at least two conductive traces are arranged in opposing regions of the housing.

15. The circuit board arrangement of claim 4, wherein the arrangement comprises at least three circuit boards and at least three conductive traces, the at least three conductive traces insulated from one another, via which:
the first circuit board is in electrical contact with the second circuit board;
the second circuit board is in electrical contact with a third circuit board; and
the first circuit board is in electrical contact with the third circuit board.

* * * * *